United States Patent [19]

Richards et al.

[11] Patent Number: 5,204,615
[45] Date of Patent: Apr. 20, 1993

[54] MODULE ATTACHMENT FOR PRINTED CIRCUIT BOARD TEST FIXTURES

[75] Inventors: Michael A. Richards, Congleton, England; Ulf R. Langgard, Overland Park, Kans.

[73] Assignee: Interconnect Devices, Inc., Kansas City, Kans.

[21] Appl. No.: 782,077

[22] Filed: Oct. 24, 1991

[51] Int. Cl.$^5$ ............................................. G01R 1/06
[52] U.S. Cl. ........................... 324/158 F; 324/158 P; 439/482
[58] Field of Search ............... 324/158 F, 158 P, 72.5; 439/482, 70, 824; 269/901

[56] References Cited

U.S. PATENT DOCUMENTS

| | | | |
|---|---|---|---|
| 3,723,867 | 3/1973 | Canarutto | 324/158 F |
| 4,038,599 | 7/1977 | Bove et al. | 324/158 F |
| 4,321,533 | 3/1982 | Matrone | 324/158 P |
| 4,357,575 | 11/1982 | Uren et al. | 324/158 F |
| 4,383,217 | 5/1983 | Shiell | 324/158 F |
| 4,496,903 | 1/1985 | Paulinski | 324/158 P |
| 4,774,462 | 9/1988 | Black | 324/158 P |
| 4,788,496 | 11/1988 | Maelzer et al. | 324/158 P |
| 4,833,404 | 5/1989 | Meyer et al. | 324/158 F |
| 4,835,469 | 5/1989 | Jones et al. | 324/158 F |
| 4,906,920 | 3/1990 | Huff et al. | 324/158 P |
| 4,912,399 | 3/1990 | Greub et al. | 324/158 P |
| 4,978,912 | 12/1990 | Vonder et al. | 324/72.5 |
| 4,983,910 | 1/1991 | Majidi-Ahy et al. | 324/158 P |
| 4,987,364 | 1/1991 | Watts | 324/158 P |
| 4,994,737 | 2/1991 | Carlton et al. | 324/158 P |
| 5,006,793 | 4/1991 | Gleason et al. | 324/158 P |
| 5,006,808 | 4/1991 | Watts | 324/158 P |
| 5,010,249 | 4/1991 | Nishikawa | 324/158 P |
| 5,012,187 | 4/1991 | Littlebury | 324/72.5 |
| 5,015,946 | 5/1991 | Janko | 324/158 P |

Primary Examiner—Vinh Nguyen
Attorney, Agent, or Firm—Wm. Bruce Day

[57] ABSTRACT

A module attachment for testing a linear high density array of test sites on a printed circuit board having such circuit test sites where an integrated circuit chip (IC) is to be mounted. Present IC's may have wire lead spacings as close as 0.010 inch with integrated chip development utilizing even more compact and close center pad spacing, such as 0.004 inch. This spacing is too close to use even the thinnest of spring contact probes. The module carries an array of densely packed thin wires embedded in a small matrix block mounted on spaced supports, which may be conventional, large diameter spring contact probes. Electrical connection to the array of wires in the module is done by each wire being connected to a separate wire lead with the wires bundled and routed to a test computer. In its closest wire spacings, the module permits testing of the densest IC's and in wider spacings, provides a low cost alternative to spring contact probes. The mounting interface between the supports and the module is an adjustable bar for precisely positioning the wires with the test sites. Comb structures of selected spacing hold the wires in position and facilitate ease of manufacture. Several embodiments are disclosed including varieties with bottom wire lead connections, side wire lead connections, staggered side lead connections, and special wire tips that can scratch through varnish or other contaminants on the test site.

15 Claims, 6 Drawing Sheets fig. 1 fig. 2 fig.3 fig.4 fig.5 fig.6 fig.7 fig.8 fig. 13 fig. 14 fig. 15

MODULE ATTACHMENT FOR PRINTED CIRCUIT BOARD TEST FIXTURES

FIELD OF THE INVENTION

The present invention relates to electrical contact test probes, and more particularly to test probe and fixture arrangements for contacting the high density leads of integrated circuit devices.

BACKGROUND OF THE INVENTION

Probes as thin as 0.007" diameter have been utilized for high density testing, however such high density probes are extremely expensive, have limited life cycle, and have a downward limit as to their center spacing and a minimum spring force. These spring contact probes must be installed in a fixture having sufficient room for drilling holes in a side by side array, inserting receptacles into the fixture holes and then inserting probes into the receptacles. Integrated circuit technology has progressed and resulted in integrated circuit packages becoming increasingly compact and complex, resulting in smaller packages and higher lead densities. Several techniques have been utilized for testing the circuit pads of printed circuit boards prior to installation of the integrated circuit package; these have been of several types, including the "bed of nails" fixture arrangement in which a matrix block is pre-drilled with a grid like array of holes. Receptacles and probes are positioned in the holes to conform to the test sites on the printed circuit board. Where an integrated chip package is to be mounted on the printed circuit board, the test fixture must be specially adapted for testing the IC test sites with even finer and more densely packed probe positions in those areas. The result of this is that when testing integrated chip pad positions on a printed circuit board, each fixture must be individualized.

The close center testing required for the pad test sites of printed circuit boards has been a significant problem to fixture manufacturers and users alike as the majority of printed circuit boards have mixed technology components fitted on the same matrix. Mixed technology refers to both conventional through board and surface mount technology components. With these different types of components, there is a variation of pitch between test pads, or space between test pads, which can vary from 0.100 to as little as 0.006 inch. This unavoidably increases the complexity of the test fixture. Standard test fixtures have a nine millimeter probe plate which accommodates the spring contact probe receptacle. Setting u this probe plate is a relatively simple procedure, providing that the test pad centers do not decrease below 0.050 inch pitch or spacing. If the center distance between pads is reduced from 0.050 pitch, due to including an IC package footprint on the circuit board for example, the fixture manufacturer must modify the probe plate. In the modification, accurate engineering modifications would have to be made and would include a reduction in the thickness of the probe plate material in the vicinity of close center test pads deemed necessary for test probe access. Another method is to construct a block, or probe matrix, and insert this into the standard probe plate. Both of these methods have their limitations and are extremely difficult to construct. The most commonplace problem generated by these modifications lies in the physical removal of probe plate material necessary to accommodate the matrix and the lack of side wall support for standard 0.100, 0.075 and 0.050 inch pitch probes to be mounted within close tolerance of this area.

Accordingly, an increasing need in the industry has been seen for a fixture arrangement which can easily and quickly be adapted to test the close pad pitches of high density integrated circuit packages. As integrated circuit packages become even smaller and more complex, the complexity of the task for the testing facility increases dramatically, quickly reaching a point where conventional spring contact probe technology can no longer be used. Therefore, what is desired is an arrangement for high density testing that can be easily and quickly adapted to different IC package configurations and in which the probe or conductor tips can be precisely aligned with the test site pads for an integrated circuit package.

SUMMARY OF THE INVENTION

Accordingly, the present invention has an object to provide a high density probe arrangement that is registerable wit the test sites on a printed circuit board to be tested, wherein the test sites are for an integrated circuit package to be later mounted on the printed circuit board. Another object of this invention is to provide a probe arrangement which can be easily used on standard "bed of nails" fixture matrixes and which does not require specially constructed or custom fixture boards.

Yet another object is to provide a low cost alternative to the expensive, ultra thin spring contact probes which are now used to test IC pad sites.

Still another object is to provide a testing module with a mounting arrangement that permits adjustment for precisely registering test wires with test pad sites.

Another object is to provide a testing module that is designed for precise and low cost construction. One method by which this is accomplished is by providing a plurality of selected comb structures with predrilled passages for test wires and selected spacings for the test wires so that manufacture is readily done by selecting the appropriate comb structure.

The present invention utilizes a module attachment such as formed of a rectangular bar of insulating matrix material and which has opposite ends mechanically supported on pins or other supports extending outwardly from an underlying fixture block. A densely spaced array of wires extends outwardly from the module for contact with densely spaced pads on a printed circuit board, such as pads for mounting an integrated circuit package. Conductor leads extend from the wires for connection to a wiring harness of the test fixture. Various forms and alternative embodiments of the invention are also disclosed and include particular configurations of the wires with special resilient mounts to urge the wire tips into engagement with the test pads, special tip ends on the wires to penetrate varnish or other surface contaminants so as to obtain a good electrical signal, and various geometries of the test wires as they extend from the module. Other arrangements of the module attachment lie in the configuration of the wire leads which extend from the module for connection to wiring bundles routed to a test computer. These wire leads may be positioned to extend from the bottom, side, or may be staggered along the sides of the module. In yet other arrangements, an even more densely packed module may be constructed by providing probe wires positioned oppositely and extending toward each other from opposite sides of the module.

All these configurations employ a simple, modular design with a closely spaced array of probe wires extending therefrom and matched to the number and pitch of the IC package test pads. As aforesaid, the module is easily and quickly mounted on pins extending outwardly of the test fixture matrix; these pins ar preferably large size spring contact probes which in the disclosed arrangement do not provide electrical connection but merely provide a mechanical means of support for the module attachment. Use of the spring contact probes to mount the module attachment to the fixture matrix is particularly advantageous because the probes are spring loaded, thereby giving a spring biased engagement effect to the module as it contacts the IC test pad sites.

The probes engage the module through an adjustment bar mechanism which can be manipulated during installation to precisely align the module wires with the test pad sites. The module also uses a unique comb structure that has predrilled holes for wire passage. The manufacturer selects a comb structure with the required wire spaces for the pitches of the test pads, making it simple to supply the modules in a range of pitches.

Other objects and advantages of the present invention will become apparent from the following detailed description when taken in conjunction with the attached drawings and claims. The following detailed description is not to be taken as limiting except insofar a required in the claims.

DESCRIPTION OF THE PREFERRED EMBODIMENT

As required, a detailed embodiment of the present invention is disclosed herein. It is, however, to be understood that the disclosed embodiment is merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Figure 1:
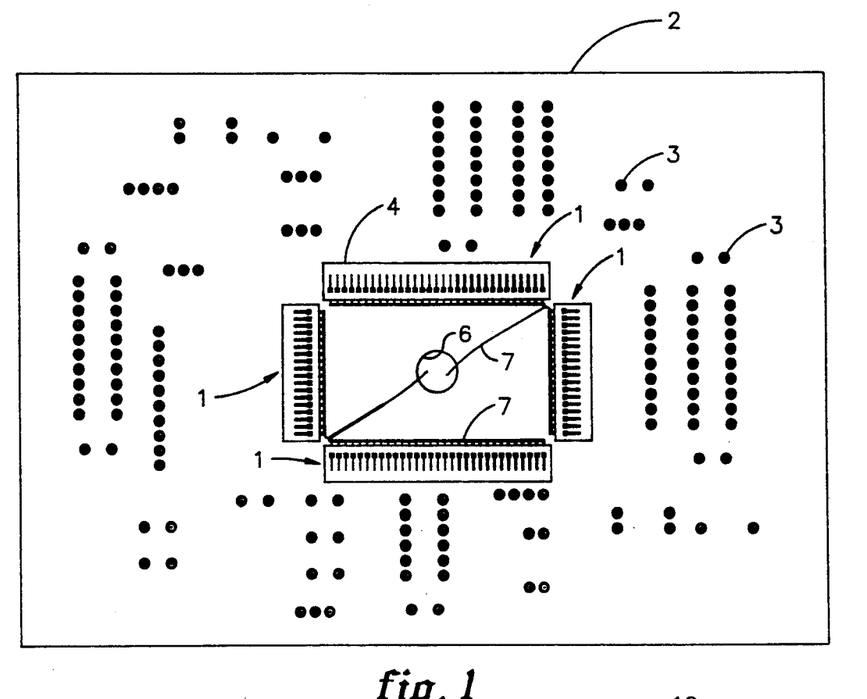
FIG. 1 is a top plan view of a fixture matrix having an array of electrical spring contact test probes mounted therein and with four modules attached thereto embodying the present invention.

The reference numeral 1, FIG. 1, generally indicates a module for attachment to a test fixture matrix 2, which, in the illustrated example, is a conventional "bed of nails" grid array of holes for mounting receptacle and probe pairs at selected locations. In the example depicted in FIG. 1, the holes are not shown for purposes of clarity but shown are a plurality of vertically oriented spring contact electrical probes 3 in a predetermined configuration. The four modules 1 shown in FIG. 1 are arranged in a quadrilateral pattern 4 about a center hole 6. Electrical continuity for the probes 3 and the modules 1 is accomplished by wiring bundles ultimately connected to a test computer or in some circumstances, a simple test circuit which checks for electrical continuity of the test sites under the device under test, such as the printed circuit boards shown in FIG. 2. For electrical connection, the probes 3 are connected at their tail ends conventionally to wire leads (not shown). The modules 1 are connected via wiring bundles 7 which are fed through the hole 6 and to the underside of the matrix 2, where they are connected to industry standard 28 or 30 American Wire Gauge wire for connection to the test circuit. The hole 6 may be sealed later for airtightness for a vacuum actuated fixture. Alternatively, if a center hole is not present, the wire leads may be routed through unoccupied probe holes in the fixture matrix 2, which may also be sealed as by grommets and sealants.

Figure 2:
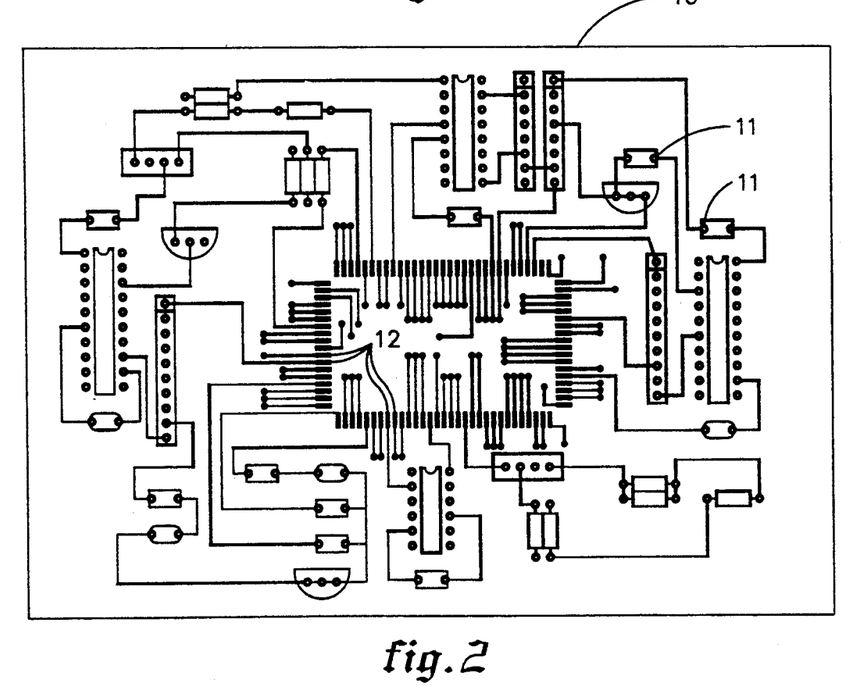
FIG. 2 is a top plan view of a printed circuit board to be tested and showing an integrated circuit package with lead pads arranged in a typical configuration.
Figure 3:
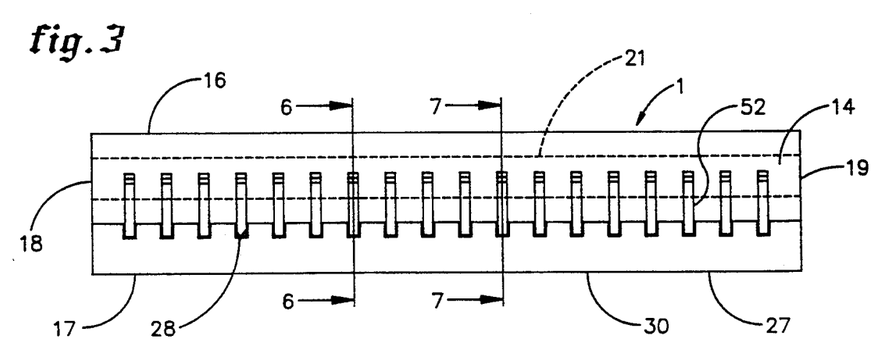
FIG. 3 is an enlarged top plan view of a module attachment according to the present invention.
Figure 4:
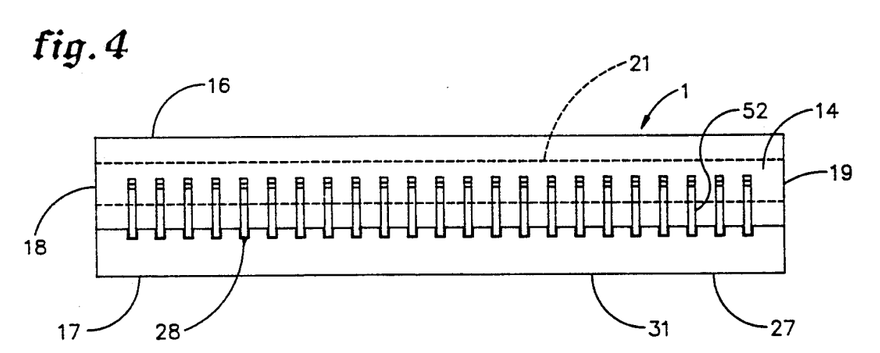
FIG. 4 is an enlarged top plan view of a module attachment according to the present invention and utilizing a different pitch spacing than the embodiment shown in FIG. 3.
Figure 5:
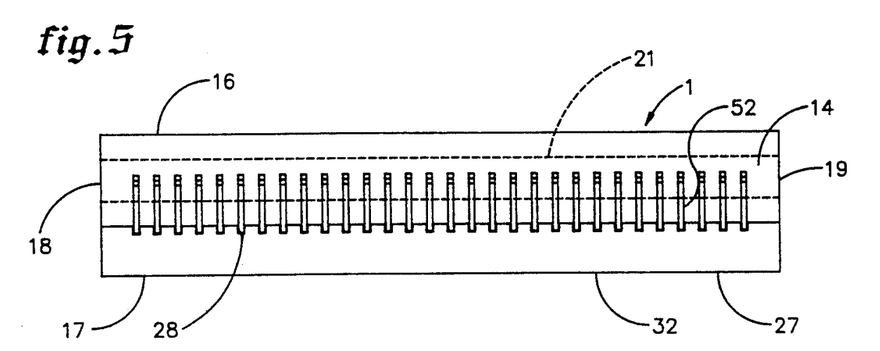
FIG. 5 is an enlarged top plan view and showing yet another different comb spacing than the embodiments shown in FIGS. 3 and 4.

Shown in FIG. 2 is a typical printed circuit board 10 having a plurality of circuit runners and test sites. Each test site is normally identified on a printed circuit board by a circular pad 11, of which the numeral 11 refers to one such pad as an example. The exemplary printed circuit board 10 also includes a center position for mounting an integrated circuit package such as an Intel 80386 IC. The integrated circuit pads are the small lines shown at 12 which form lines arranged in a quadrilateral pattern. The exemplary printed circuit board 10 is not intended to illustrate any particular circuit board or even a functional circuit and is intended to illustrate merely a board which has a combination of conventional through-hole technology and surface mount technology. In the illustrated example, the pads 11 have holes extending therethrough by which resisters, capacitors and other components are mounted with lead wires from the components positioned in the holes and soldered. In distinction, the lines 12 are the mounting pads to which lead wire feet from the IC are soldered.

Each module line is generally configured to be positioned upon spaced mounting posts, which may be spring contact electrical test probes extending from the test fixture 2. These probes provide a mechanical mount and electrical continuity is neither required or used.

Referring to FIGS. 3, 6, 7 and 8, the module 1 generally comprises an elongate bar of insulating material, such as of glass filled nylon or fiberglass, such as of the fiberglass composing a printed circuit board. The module 1 has a first top side 14, a second bottom side 15, opposite side walls 16 and 17 and opposite ends 18 and 19. Together, the sides 14, 15, walls 16 and 17 and ends 18 and 19 form an elongate, bar shaped rectangular structure. Extending into the module from the bottom side 15 is a generally T-shaped slot 21 which provides a means for mounting the module 1 on the probes 3. In the illustrated example, the slot 21 is offset toward the side wall 16 of the module 1 and extends longitudinally, consisting of a substantially square channel portion 22, FIG. 7 and a narrower neck portion 23. In the examples shown in FIGS. 6, 7 and 8, a particular adjustable mounting means 25 is disclosed although other appropriate means for mounting may be used as necessary.

Also forming a portion of the module as shown in FIGS. 3 through 8 is a side strip 27 which is composed of the same material as in the remainder of the module 1 and is glued or otherwise affixed along a side. The side strip 27 forms a comb structure having a plurality of evenly spaced, top to bottom grooves 28. The grooves are preferably square sided to accommodate square shank wires as hereinafter described. The grooves 28 are spaced center to center to conform to the pad pitch or pad spacing of the integrated circuit test pad sites for which a selected module 1 is to be used. For example, the side strip 27 may be manufactured in groove spacings or pitches of 0.050 inch, as shown in the side strip 30, FIG. 3, or a 0.025 side strip 31, FIG. 4, or a 0.010 side strip 32, FIG. 5. The side strips are preferably manufactured in the following pad pitches: 0.050, 0.040, 0.030, 0.025, 0.020, 0.015, 0.010 and 0.006 inch, so as to accord with a wide range of test pad site spacings. Manufacture is made easy by the use of side strips 27 of selected pitch or spacing because the strips can be formed by a milling machine or be molded and do not have to be drilled. The side strip is connected to the module 1 by gluing or other appropriate bonding method.

To mount the module on the spaced mounting posts, a mounting means such as aforementioned is utilized. In the illustrated example, FIGS. 6, 7 and 8, the mounting means comprises an elongate bar such as of brass which is slidably received within the square channel portion 22, of the T-shaped slot 21. The mounting bar 34 includes a plurality of mounting post receiving holes 36 drilled partially through or countersunk into the mounting bar 34 and at spacings consistent with the spacings with the probe holes of the fixture matrix 2. The mounting bar 34 snugly fills the square channel portion 22 and is longitudinally moveable therein. Adjacent to the end 19 is a screw forming a cap 37 closing the end of the slot 21 and a spring 39 urging the mounting bar 34 away from the end cap 37. An adjustment screw 40 is manipulated by a appropriate tool such as an Allen wrench of minute proportions. Preferably, the adjustment screw 40 has self tapping threads which cut into the walls of the square channel portion 22. Upon rotation of the adjustment screw 40 as by the Allen wrench, the module 1 is moved relative to the mounting bar 34, which is in fixed relation to the support or mounting post and thereby manipulated so that probe wires extending from the module 1 are precisely located with respect to test site pads.

Figures 6, 7, 8:
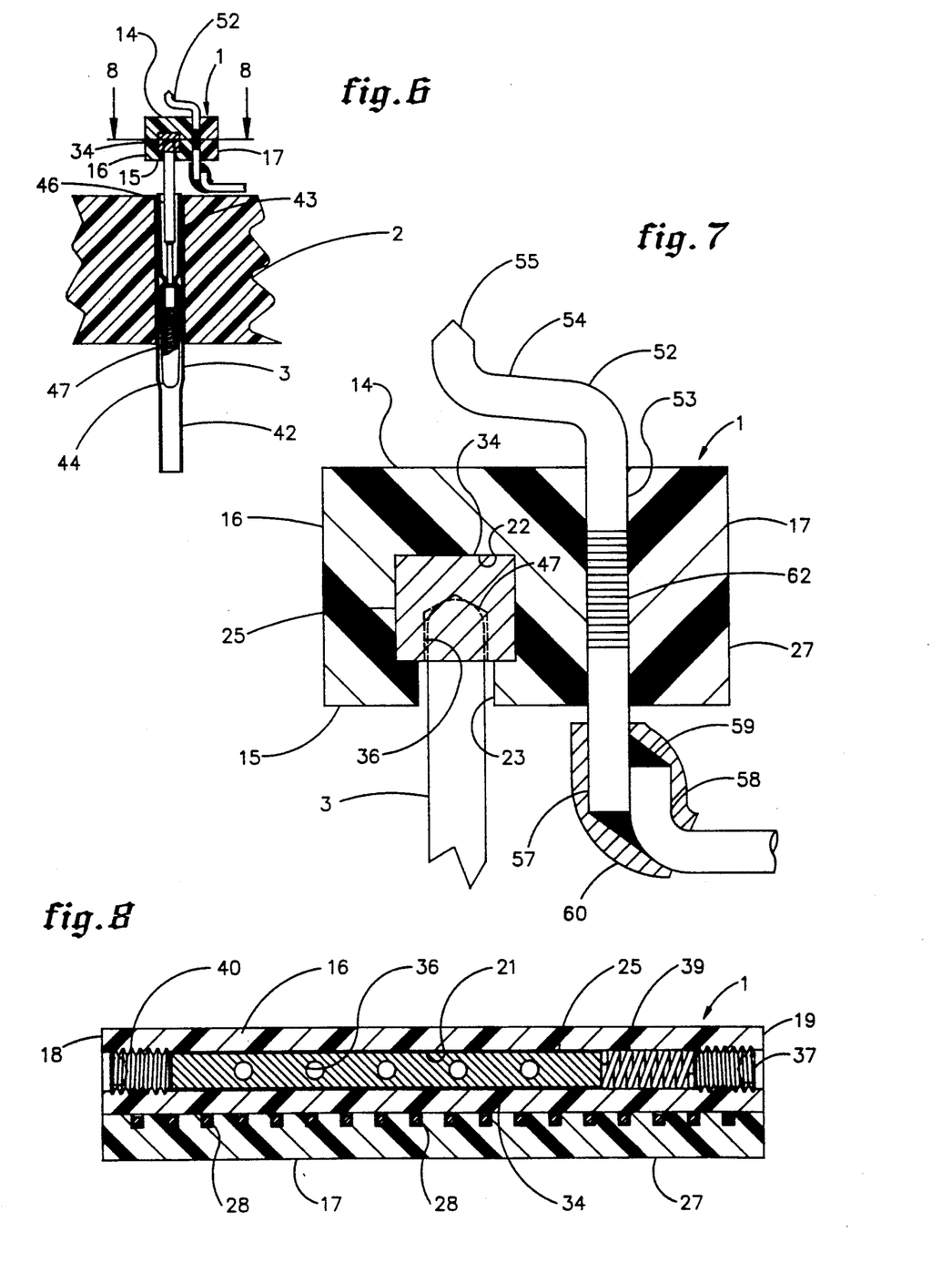
FIG. 6 is a transverse sectional view taken along lines 6—6, FIG. 3.
FIG. 7 is a transverse sectional view taken along lines 7—7, FIG. 3 and greatly enlarged thereover.
FIG. 8 is a longitudinal sectional view taken along lines 8—8, FIG. 6.

The module 1 is positioned atop spaced mounting posts which fit into the mounting post receiving holes 36. In the illustrated example, the mounting posts comprise probes 3 which are electrical spring contact probes of significantly large respective size, such as used for 0.100" or greater centers. Examples of suitable mounting post probes include the Interconnect Devices Inc. Series SL, Size 25, Size 3, Size 4 or Size 5 probes. An exemplary type of probe is shown in FIG. 6 and consists of an outer receptacle 42 with an inner probe assembly 43 including a barrel 44 and a plunger 46 urged outwardly by a spring 47. The plunger 46 preferably has a plain tip end 49 for fitting into the mounting post receiving holes 36 and is secured thereto as by an adhesive. Probe wires 52 extend from the module 1. Preferably, the probe wires 52 are square shank wires of highly conductive gold plated stainless steel and as shown in FIG. 7, are generally in the same of an inverted L having a downwardly extending leg 53, a horizontal portion 54 and an upturned chisel shaped tip 55. The tip 55 is chisel shaped in order to scrape through varnish and other contaminants on the test site pad. The horizontal portion 54 is of sufficient length to position the tip 55 over the extended center line of the mounting bar 34 so that as the module 1 is moved into contact with a linear array of test pad sites and the tip 55 contacts the site and slightly resiliently bends, the force of the contact is generally aligned with the mounting bar 34 to induce little or no twisting moment. The leg 53 extends downwardly of the bottom side 15 and forms a connection end 57 to which a wire lead 58 is attached as by a solder connection 59. Preferably, the connection 59 is covered by a plastic sleeve 60. Such an arrangement is commercially available as a pre-soldered Teflon sleeve which is fitted over the connection, heat applied to solder the wire leads together and a Teflon sleeve simultaneously shrunk about the solder connection.

Also on the probe wire leg 53 is a plurality of grooves 62 which are preferably on the longitudinal sides of the square shank of probe wire 52; that is, the grooves 62 respectively face the ends 18 and 19 and not the side walls 16 and 17. The purpose for this selective placement of the grooves 62 aligned with the ends 18 and 19 is that the grooves facilitate the grip of adhesive into the square shank holes of grooves 28 of the comb structure side strip 27 and might interfere with the gluing if the orientation was toward the side wall 16 and 17. It will be appreciated that the grooves 62 provide additional surface area for adhesive bonding and securing the probe wires 52 within the side strip grooves 28. Note also that the square shank of the probe wire 52 in conjunction with the square side strip grooves 28 prevents rotation of the probe wires 52 relative to the module 1.

Although the best mode of the invention known at the time of filing is shown in connection with FIGS. 1 and 3 through 8, other forms may be equally useful, depending upon the environment of use and the configuration of the test site. An alternative embodiment of post mounting means is shown in connection with FIG. 9 wherein a probe 3 is used in which the plunger 46 does not terminate in a plain tip end 49 as shown in FIG. 7 but terminates in an expanded tip end 64. The module 1 provides the T-shaped slot 21 with its square channel portion 22 and neck portion 23 but does not provide a mounting bar 34 situated therein. The expanded tip end 64 fits tightly within the T-shaped slot 21 in a snug friction fit. Adjustment is accomplished by directly manipulating the tip end 64 and sliding it along the slot 21.

Figure 9:
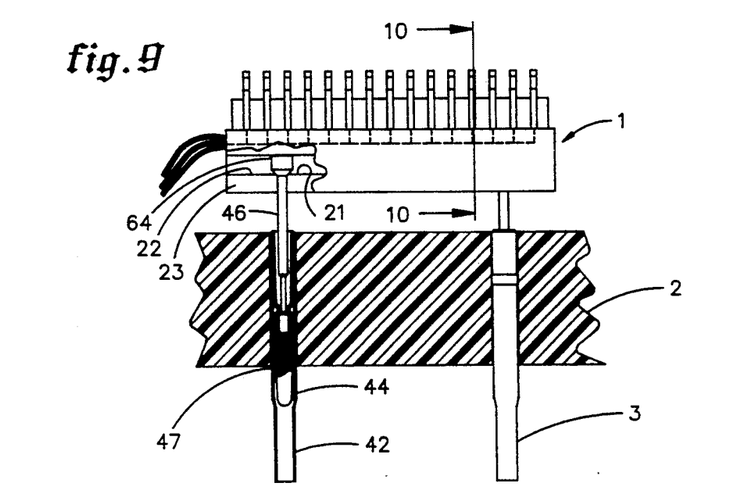
FIG. 9 is a side elevational view of an alternative embodiment of the invention.

The embodiment shown in FIG. 9 also lacks the comb structure side strip 27 and instead provides a probe wire 66 which is generally "C" shaped and molded into the module 1. The probe wire 66 has an upturned tip 67 generally aligned above the slot 21 for reducing torque moment and has a connection end 68 emerging from the side wall 16. A strip 69 of resilient material such as synthetic rubber positioned under the tip 67 facilitates resiliency and helps urge the tip 67 into the test site.

Figure 10:
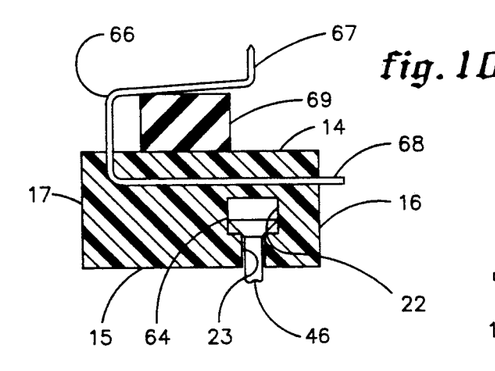
FIG. 10 is a transverse sectional view taken along lines 10—10, FIG. 9.
Figure 11:
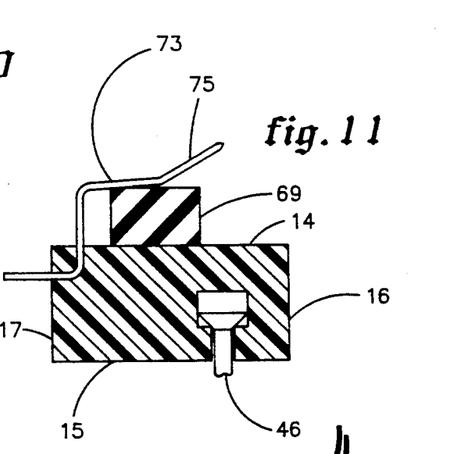
FIG. 11 is an alternative embodiment of the structure show in FIG. 10.

FIG. 11 shows an alternative variation on the probe wire 66 of FIG. 10 wherein a probe wire 73 has a side exit from the side 17 and a tip 75, instead of being turned upwardly in approximately a 90 degree angle as shown in FIG. 10, is turned upwardly at approximately a 45 degree angle. When the tip 75 engages the test site pad, it tends to flex outwardly with a scraping action on the test site, thereby insuring good electrical contact.

Figure 12:
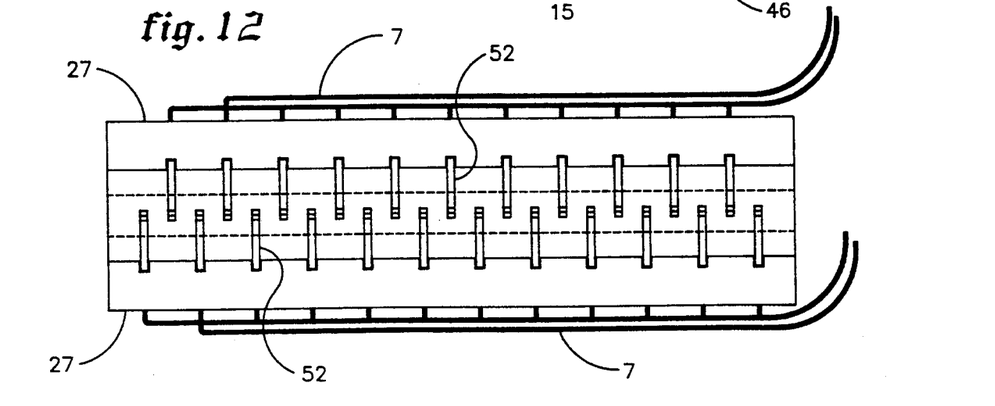
FIG. 12 is a top plan view showing an alternative structure of the invention.

The embodiment shown in FIG. 12 utilizes two side strips 27, each with probe wires 52 such as shown in FIG. 7. Wiring bundles 7 extend respectively out from below each of the side strips 27. This arrangement may be of certain use for particularly densely packed IC's having very closely spaced wire feet.

Figure 13:
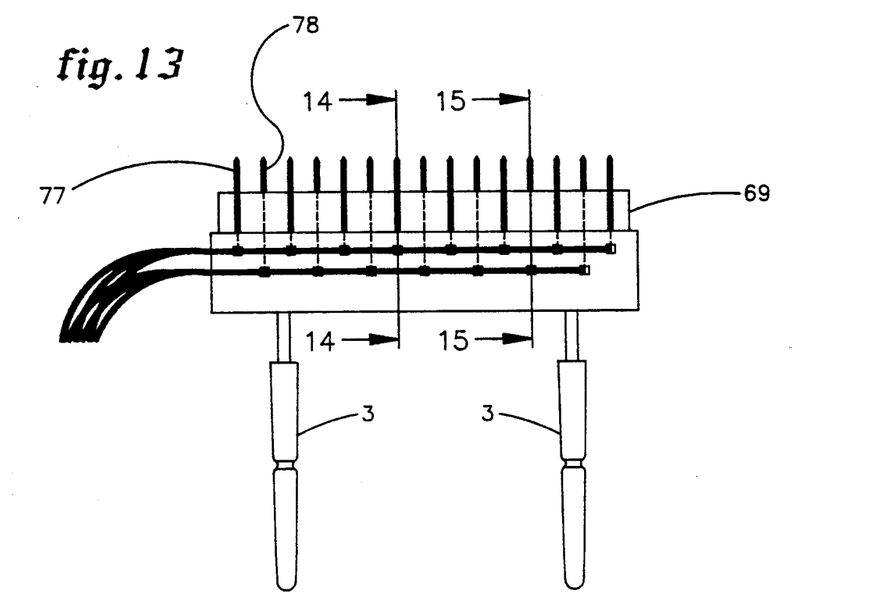
FIG. 13 is a side elevational view of the structure shown in FIG. 12.
Figures 14, 15:
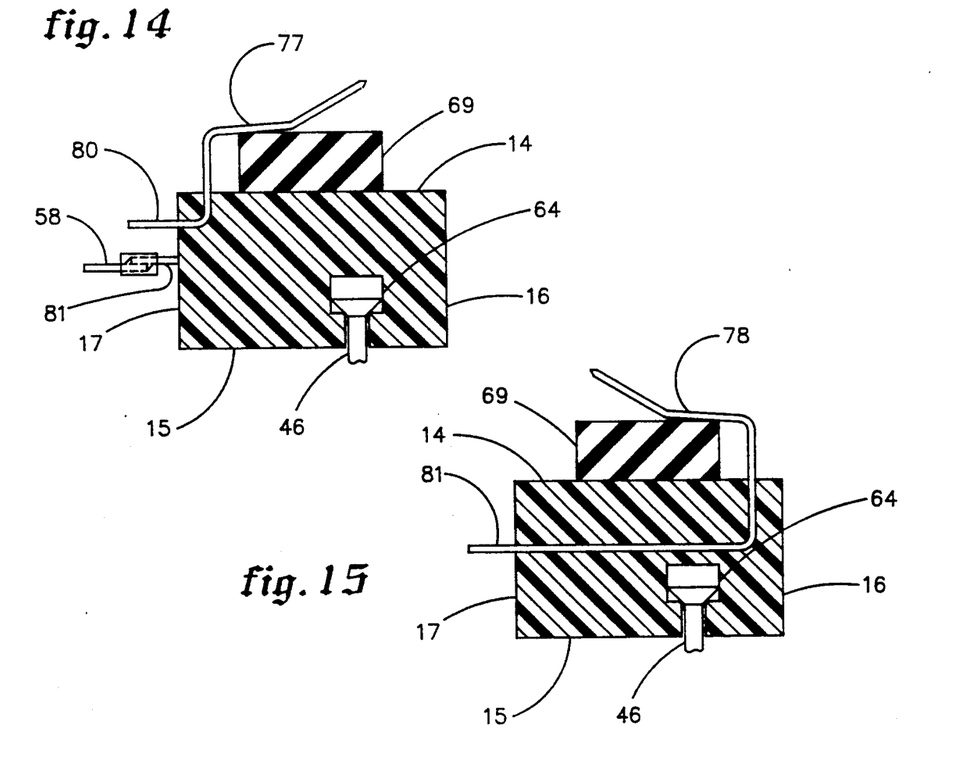
FIG. 14 is a transverse sectional view taken along lines 14—14, FIG. 13.
FIG. 15 is a transverse sectional view taken along lines 15—15, FIG. 13.

FIG. 13 shows a module arrangement having staggered sets of probe wires 77 and 78, with each of the sets 77 and 78 positioned adjacent to different side walls 16 and 17, FIGS. 14 and 15. The wire 78 of FIG. 15 is of the same configuration as shown by the wire 66 of FIG. 10 and the wire 77 of FIG. 14 is of the same configuration as the wire 73 of FIG. 11. In FIG. 13 the embodiment shown combines both types of probe wires in a single module with the wires supported by a resilient strip 69. Note that the respective connection ends 80 and 81 of the wires 77 and 78 exit from the side wall 17 at different heights, allowing for joining of the connector ends 80 and 81 to wire leads 58.

Figure 16:
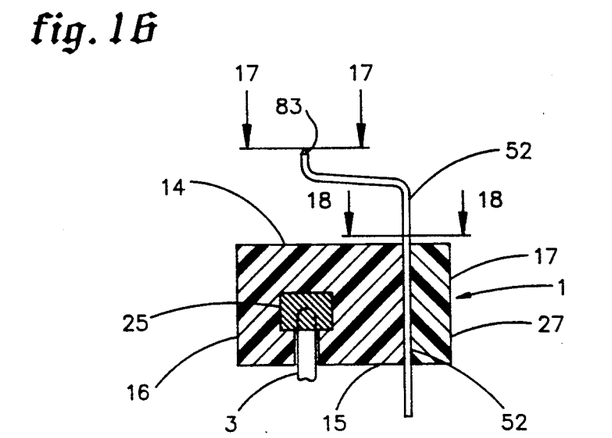
FIG. 16 is a transverse sectional view showing details of a probe wire extending from the module of the present invention.
Figure 17:
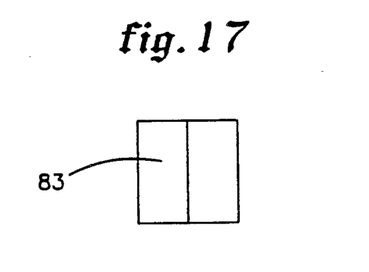
FIG. 17 is a sectional view taken along lines 17—17, FIG. 16.
Figure 18:
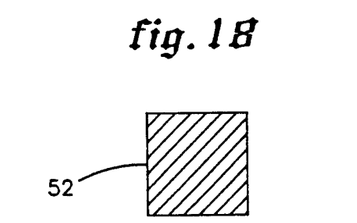
FIG. 18 is a sectional view taken along lines 18—18, FIG. 16.

FIG. 16 particularly illustrates the configuration of the desired embodiment of the probe bar 52, which is a square shank wire, particularly shown in connection with FIG. 18. FIG. 17 shows that the preferred wire has a chisel tip 83. The chisel tip 83 facilitates scraping through varnishes and contaminants on the probe test site.

Figure 19:
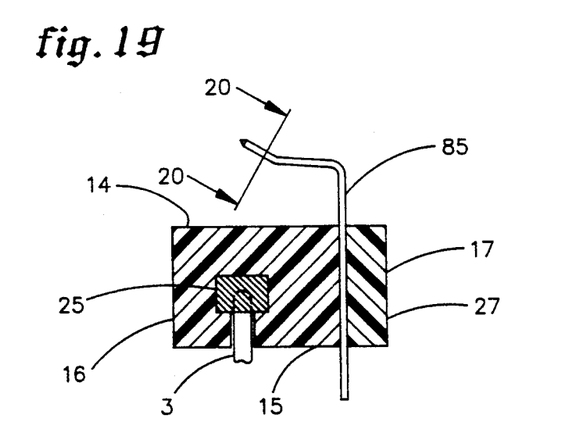
FIG. 19 is a cross sectional view of yet another alternative embodiment of the module arrangement showing a probe wire of bi-metallic materials.
Figure 20:
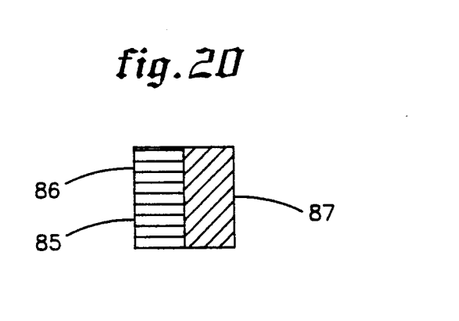
FIG. 20 is a sectional view taken along lines 20—20, FIG. 19.

FIGS. 19 and 20 show a probe wire 85 having a square shank and which is of bi-metallic materials. In this arrangement each side 86 and 87 of the probe wire 85 is of a metal alloy having a different resilience or index of elasticity relative to the other side. The 45 degree angled tip of the probe wire 85 moves downwardly upon contacting a test site, thereby scraping the surface for electrical contact and also moves sidewardly because of the bi-metallic materials 86 and 87.

Figure 21:
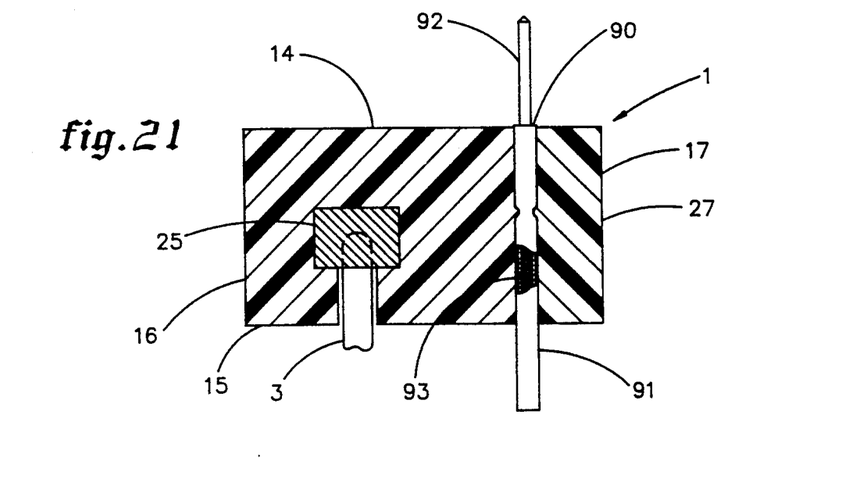
FIG. 21 is yet another alternative embodiment of the present invention and showing the module arrangement supporting a spring contact electrical test probe.

FIG. 21 illustrates an ultra fine diameter spring loaded electrical contact probe 90 that may be emplaced within the module 1 instead of a probe wire, such as a probe wire 52. A preferred probe 90 for emplacement within the module 1 would be the Interconnect Devices, Inc. Quad O Probe which consists of a barrel 91 placed directly within the groove 28 and secured as by cementing. A plunger 92 extends from the barrel 91 and is urged outwardly by an internal spring 93. This arrangement may be used as desired in place of a probe wire. These ultra fine diameter probes typically have a stroke of about 0.050" whereas the larger diameter probes normally used in a bed of nails test fixture have a stroke of approximately 0.250, making both types of probes incompatible with each other. Use of ultra fine diameter probes in the module 1 provides a method by which standard size probes, such as probes on 0.100 inch or greater centers may be used in conjunction with the first mentioned probes having center to center spacings of as little as 0.020 inch. Using the ultra fine probes with a 0.050" stroke in the module 1 permits compatibility with standard size probes having a 0.250" stroke.

Use of the invention may be readily accomplished by matching the configuration of the module 1 to the configuration of the test site pads on the device under test. Selection of a module 1 having the proper spacing or pitches for the test pads is accomplished by selecting the appropriate comb structures with the appropriate thickness of probe wires. Additionally, staggered probe wires may be used as desired or as appropriate for the most densely packed IC connections.

Particularly dirty or contaminated boards may require use of special tips or tips having special movement in order to scrape off varnish and contaminants. Additionally, during the setup phases longitudinal adjustment for correspondence of the probe wires with the test sites may be readily accomplished by manipulation of the mounting means, whether the mounting means be the mounting bar 34 with adjustment screw 40 or manipulating the friction fit expanded head test probes.

It is to be understood that while several embodiments of the invention have been described and shown, the invention is not to be limited thereto except insofar as set forth in the following claims.

What is claimed and desired to be secured by Letters Patent is as follows:

1. A module attachment for a test fixture for printed circuit boards comprising:
   a) spaced mounting posts extending from a test fixture;
   b) a module having first and second sides with said first side having means for mounting said module upon said spaced mounting posts and supporting said module above a test fixture surface;
   c) an array of wires extending outwardly from said module second side, said array being formed to correspond with a selected test site array; and
   d) said wires having conductor leads extending from said second side said module for connection to a wiring harness of said test fixture.

2. A module attachment for a test fixture having a bed of nails array of spring contact electrical test probes for testing a printed circuit board comprising:
   a) spaced spring contact electrical test probes extending from said test fixture;
   b) a module having first and second sides with said first side having means for mounting said module upon said spaced test probes and supporting said module about a test fixture surface;

c) an array of wires extending outwardly from said module second side, said array being formed to correspond with a selected test site array;

d) said wires having conductor leads extending from said second side of said module for connection to a wiring harness of said test fixture.

3. The module attachment set forth in claim 2 wherein said module first side includes a plurality of slots for receipt of ends of said test probes.

4. The module attachment set forth in claim 3 wherein said ends of said test probes have expanded head tips and said plurality of slots are T shaped slots for a slide-on fit of said tips.

5. The module attachment set forth in claim 2 wherein each of said wires has an angular portion extending from said module and terminating in an upturned tip end, said tip end being sharp for penetration into a test site.

6. The module attachment set forth in claim 2 wherein said module has a side wall between said first and second sides and said conductor leads extend from said sidewall.

7. The module attachment set forth in claim 1 wherein said conductor leads extend from said sidewall in staggered relationship.

8. The module attachment set forth in claim 2 wherein said wires have an angular portion extending from said module and terminating in an upturned tip end and including a resilient strip positioned under said angular portion for resiliently biasing said wire.

9. The module attachment set forth in claim 2 wherein said wires are bimetallic with each metal have an elasticity different from the other and with one metal on one side of each of said wires and a different metal on the other side of said each of said wires for sideward scraping movement of said wire upon a test site as said wire contacts said test site.

10. A module attachment for a test fixture having a bed of nails array of spring contact probes comprising:
a) spaced spring contact test probes extending from said fixture;
b) a module having first and second sides with said first side having means for mounting said module above a test fixture surface, said means for mounting providing alignment adjustment;
c) an array of wires extending outwardly from Said module second side, said array being formed to correspond with a selected test site array;
d) said wires having conductor leads extending from said second side of module for connection to a wiring harness of said test fixture.

11. The module attachment set forth in claim 10 wherein said means for mounting includes a bar receiving said spaced spring contact probes and having a screw for longitudinal adjustment of said bar with respect to said module.

12. A module attachment for a test fixture having a bed of nails array of spring contact test probes for testing a printed circuit board comprising:

a) spaced spring contact probes extending from said test fixture;
b) a module having first and second sides with said first side having means for mounting said module upon said spaced spring contact probes and supporting said module above a test fixture surface;
c) said module having an edge bar portion extending there along having a plurality of spaced grooves at preselected intervals to accord with a preselected pitch of printed circuit board test pads, said edge bar being a comb structure;
d) an array of wires extending outwardly from said module second side and respectively through said spaced grooves for spacing said wires at said preselected intervals, said array being formed to correspond with a selected test pad array;
e) said wires having conductor leads extending from said second side of said module for connection to a wiring harness of said test fixture.

13. A module attachment for a test fixture having an array of probes for supporting and testing a printed circuit board, said module attachment comprising:
a) a module having first and second sides with said first side having means for mounting said module upon said probes and supporting said module above a test fixture surface;
b) an array of contact means extending outwardly from said module second side, said array of contact means being of preselected configuration to conform with a selected configuration of test pad sites of said printed circuit board; said contact means having engagement portions for electrical connection to said test pad sites for testing said printed circuit board;
c) conductor leads affixed to and extending from said module and electrically connected to said contact means, said conductor leads being for connection to a test fixture circuit for testing a printed circuit board.

14. The module attachment set forth in claim 13 wherein said module has a side strip formed of a comb structure having spaced grooves of said preselected configuration with said contact means extending from said grooves.

15. A module attachment for a test fixture for printed circuit boards comprising:
a) spaced mounting posts extending from a test fixture;
b) a module having a transverse periphery having first and second locations with said first location having means for mounting said module upon said spaced mounting posts and supporting said module above a test fixture surface;
c) an array of wires extending outwardly from said module second location, said array of wires being formed to correspond with a selected test site array; and
d) said array of wires having respective conductor leads extending from said second location of said module for connection to a wiring harness of said test fixture.

* * * * *